United States Patent
Mukhopadhyay et al.

(10) Patent No.: US 8,951,317 B1
(45) Date of Patent: Feb. 10, 2015

(54) SUPERABRASIVE ELEMENTS INCLUDING CERAMIC COATINGS AND METHODS OF LEACHING CATALYSTS FROM SUPERABRASIVE ELEMENTS

(75) Inventors: Debkumar Mukhopadhyay, Sandy, UT (US); Kenneth Eugene Bertagnolli, Riverton, UT (US)

(73) Assignee: US Synthetic Corporation, Orem, UT (US)

( * ) Notice: Subject to any disclaimer, the term of this patent is extended or adjusted under 35 U.S.C. 154(b) by 717 days.

(21) Appl. No.: 12/767,717

(22) Filed: Apr. 26, 2010

Related U.S. Application Data (60) Provisional application No. 61/172,976, filed on Apr. 27, 2009.

(51) Int. Cl.
   *B24B 1/00*     (2006.01)
   *B24D 11/00*    (2006.01)

(52) U.S. Cl.
   USPC .......................................................... 51/295

(58) Field of Classification Search
   None
   See application file for complete search history.

(56) References Cited

U.S. PATENT DOCUMENTS

| | | |
|---|---|---|
| 3,136,615 A | 6/1964 | Bovenkerk et al. |
| 3,141,746 A | 7/1964 | De Lai et al. |
| 3,233,988 A | 2/1966 | Wentorf et al. |
| 3,745,623 A | 7/1973 | Wentorf, Jr. et al. |
| 4,108,614 A | 8/1978 | Mitchell |
| 4,151,686 A | 5/1979 | Lee et al. |
| 4,224,380 A | 9/1980 | Bovenkerk et al. |
| 4,255,165 A | 3/1981 | Dennis et al. |
| 4,268,276 A | 5/1981 | Bovenkerk |
| 4,288,248 A | 9/1981 | Bovenkerk et al. |
| 4,303,442 A | 12/1981 | Hara et al. |
| 4,311,490 A | 1/1982 | Bovenkerk et al. |
| 4,373,593 A | 2/1983 | Phaal et al. |
| 4,387,287 A | 6/1983 | Marazzi |
| 4,412,980 A | 11/1983 | Tsuji et al. |

(Continued)

FOREIGN PATENT DOCUMENTS

| | | |
|---|---|---|
| EP | 0196777 | 10/1986 |
| EP | 0300699 | 1/1989 |

(Continued)

OTHER PUBLICATIONS

Mattox, Donald M. "Vacuum Deposition Processes", Products Finishing Magazine, http://www.pfonline.com/articles/vacuum-deposition-processes (Jun. 1, 1999).*

(Continued)

*Primary Examiner* — Kaj K Olsen
*Assistant Examiner* — Ross J Christie
(74) *Attorney, Agent, or Firm* — ALG Intellectual Property, LLC (57) ABSTRACT

A method of processing a polycrystalline diamond element is disclosed. The method may include depositing a vaporized material over a selected portion of a polycrystalline diamond element to form a protective coating over the selected portion. The polycrystalline diamond element may include a polycrystalline diamond table. The method may also include exposing at least a portion of the polycrystalline diamond element to a leaching solution such that the leaching solution contacts an exposed surface region of the polycrystalline diamond table and at least a portion of the protective coating. The method may also include removing the polycrystalline diamond element from the leaching solution. The protective coating may be substantially impermeable to the leaching solution.

23 Claims, 8 Drawing Sheets

(56) References Cited

U.S. PATENT DOCUMENTS

| | | | |
|---|---|---|---|
| 4,481,016 | A | 11/1984 | Campbell et al. |
| 4,486,286 | A | 12/1984 | Lewin et al. |
| 4,504,519 | A | 3/1985 | Zelez |
| 4,522,633 | A | 6/1985 | Dyer |
| 4,525,179 | A | 6/1985 | Gigl |
| 4,534,773 | A | 8/1985 | Phaal et al. |
| 4,556,403 | A | 12/1985 | Almond et al. |
| 4,560,014 | A | 12/1985 | Geczy |
| 4,570,726 | A | 2/1986 | Hall |
| 4,572,722 | A | 2/1986 | Dyer |
| 4,604,106 | A | 8/1986 | Hall et al. |
| 4,605,343 | A | 8/1986 | Hibbs, Jr. et al. |
| 4,606,738 | A | 8/1986 | Hayden |
| 4,621,031 | A | 11/1986 | Scruggs |
| 4,636,253 | A | 1/1987 | Nakai et al. |
| 4,645,977 | A | 2/1987 | Kurokawa et al. |
| 4,662,348 | A | 5/1987 | Hall et al. |
| 4,664,705 | A | 5/1987 | Horton et al. |
| 4,670,025 | A | 6/1987 | Pipkin |
| 4,707,384 | A | 11/1987 | Schachner et al. |
| 4,726,718 | A | 2/1988 | Meskin et al. |
| 4,731,296 | A | 3/1988 | Kikuchi et al. |
| 4,766,040 | A | 8/1988 | Hillert et al. |
| 4,776,861 | A | 10/1988 | Frushour |
| 4,784,023 | A | 11/1988 | Dennis |
| 4,792,001 | A | 12/1988 | Zijsling |
| 4,793,828 | A | 12/1988 | Burnand |
| 4,797,241 | A | 1/1989 | Peterson et al. |
| 4,802,539 | A | 2/1989 | Hall et al. |
| 4,807,402 | A | 2/1989 | Rai |
| 4,828,582 | A | 5/1989 | Frushour |
| 4,844,185 | A | 7/1989 | Newton, Jr. et al. |
| 4,854,405 | A | 8/1989 | Stroud |
| 4,861,350 | A | 8/1989 | Phaal et al. |
| 4,871,377 | A | 10/1989 | Frushour |
| 4,899,922 | A | 2/1990 | Slutz et al. |
| 4,919,220 | A | 4/1990 | Fuller et al. |
| 4,940,180 | A | 7/1990 | Martell |
| 4,943,488 | A | 7/1990 | Sung et al. |
| 4,944,772 | A | 7/1990 | Cho |
| 4,976,324 | A | 12/1990 | Tibbitts |
| 5,011,514 | A | 4/1991 | Cho et al. |
| 5,027,912 | A | 7/1991 | Juergens |
| 5,030,276 | A | 7/1991 | Sung et al. |
| 5,092,687 | A | 3/1992 | Hall |
| 5,096,465 | A | 3/1992 | Chen et al. |
| 5,116,568 | A | 5/1992 | Sung et al. |
| 5,127,923 | A | 7/1992 | Bunting et al. |
| 5,135,061 | A | 8/1992 | Newton, Jr. |
| 5,176,720 | A | 1/1993 | Martell et al. |
| 5,186,725 | A | 2/1993 | Martell et al. |
| 5,199,832 | A | 4/1993 | Meskin et al. |
| 5,205,684 | A | 4/1993 | Meskin et al. |
| 5,213,248 | A | 5/1993 | Horton et al. |
| 5,238,074 | A | 8/1993 | Tibbitts et al. |
| 5,264,283 | A | 11/1993 | Waldenstrom et al. |
| 5,337,844 | A | 8/1994 | Tibbitts |
| 5,355,969 | A | 10/1994 | Hardy et al. |
| 5,370,195 | A | 12/1994 | Keshavan et al. |
| 5,379,853 | A | 1/1995 | Lockwood et al. |
| 5,439,492 | A | 8/1995 | Anthony et al. |
| 5,464,068 | A | 11/1995 | Najafi-Sani |
| 5,468,268 | A | 11/1995 | Tank et al. |
| 5,496,638 | A | 3/1996 | Waldenstrom et al. |
| 5,496,639 | A | 3/1996 | Connell et al. |
| 5,505,748 | A | 4/1996 | Tank et al. |
| 5,510,193 | A | 4/1996 | Cerutti et al. |
| 5,523,121 | A | 6/1996 | Anthony et al. |
| 5,524,719 | A | 6/1996 | Dennis |
| 5,560,716 | A | 10/1996 | Tank et al. |
| 5,607,024 | A | 3/1997 | Keith et al. |
| 5,620,302 | A | 4/1997 | Garrison et al. |
| 5,620,382 | A | 4/1997 | Cho et al. |
| 5,624,068 | A | 4/1997 | Waldenstrom et al. |
| 5,645,617 | A | 7/1997 | Frushour |
| 5,667,028 | A | 9/1997 | Traux et al. |
| 5,718,948 | A | 2/1998 | Ederyd et al. |
| 5,722,497 | A | 3/1998 | Gum et al. |
| 5,722,499 | A | 3/1998 | Nguyen et al. |
| 5,759,216 | A | 6/1998 | Kanada et al. |
| 5,776,615 | A | 7/1998 | Wong et al. |
| 5,833,021 | A | 11/1998 | Mensa-Wilmot et al. |
| 5,875,862 | A | 3/1999 | Jurewicz et al. |
| 5,897,942 | A | 4/1999 | Karner et al. |
| 5,954,147 | A | 9/1999 | Overstreet et al. |
| 5,979,578 | A | 11/1999 | Packer |
| 6,009,963 | A | 1/2000 | Chaves et al. |
| 6,063,333 | A | 5/2000 | Dennis |
| 6,123,612 | A | 9/2000 | Goers |
| 6,126,741 | A | 10/2000 | Jones et al. |
| 6,193,001 | B1 | 2/2001 | Eyre et al. |
| 6,234,261 | B1 | 5/2001 | Evans et al. |
| 6,248,447 | B1 | 6/2001 | Griffin et al. |
| 6,269,894 | B1 | 8/2001 | Griffin |
| 6,290,726 | B1 | 9/2001 | Pope et al. |
| 6,309,554 | B1 * | 10/2001 | Fujishima et al. ............... 216/11 |
| 6,315,065 | B1 | 11/2001 | Yong et al. |
| 6,332,503 | B1 | 12/2001 | Pessier et al. |
| 6,344,149 | B1 | 2/2002 | Oles |
| 6,367,568 | B2 | 4/2002 | Steinke et al. |
| 6,410,085 | B1 | 6/2002 | Griffin et al. |
| 6,435,058 | B1 | 8/2002 | Matthias et al. |
| 6,481,511 | B2 | 11/2002 | Matthias et al. |
| 6,528,159 | B1 | 3/2003 | Kanada et al. |
| 6,544,308 | B2 | 4/2003 | Griffin et al. |
| 6,550,556 | B2 | 4/2003 | Middlemiss et al. |
| 6,562,462 | B2 | 5/2003 | Griffin et al. |
| 6,585,064 | B2 | 7/2003 | Griffin et al. |
| 6,589,640 | B2 | 7/2003 | Griffin et al. |
| 6,592,985 | B2 | 7/2003 | Griffin et al. |
| 6,601,662 | B2 | 8/2003 | Matthias et al. |
| 6,739,214 | B2 | 5/2004 | Griffin et al. |
| 6,749,033 | B2 | 6/2004 | Griffin et al. |
| 6,797,326 | B2 | 9/2004 | Griffin et al. |
| 6,861,098 | B2 | 3/2005 | Griffin et al. |
| 6,861,137 | B2 | 3/2005 | Griffin et al. |
| 6,878,447 | B2 | 4/2005 | Griffin et al. |
| 6,892,836 | B1 | 5/2005 | Eyre et al. |
| 6,904,984 | B1 | 6/2005 | Estes et al. |
| 6,935,444 | B2 | 8/2005 | Lund et al. |
| 6,962,214 | B2 | 11/2005 | Hughes et al. |
| 6,991,049 | B2 | 1/2006 | Eyre et al. |
| 7,350,601 | B2 | 4/2008 | Belnap et al. |
| 7,377,341 | B2 | 5/2008 | Middlemiss et al. |
| 7,506,698 | B2 | 3/2009 | Eyre et al. |
| 7,517,589 | B2 | 4/2009 | Eyre |
| 7,608,333 | B2 | 10/2009 | Eyre |
| 7,754,333 | B2 | 7/2010 | Eyre et al. |
| 8,147,572 | B2 | 4/2012 | Eyre et al. |
| 2001/0046835 | A1 * | 11/2001 | Wielonski et al. ............ 451/533 |
| 2004/0026132 | A1 * | 2/2004 | Hall et al. ..................... 175/427 |
| 2005/0115744 | A1 | 6/2005 | Griffin et al. |
| 2005/0129950 | A1 | 6/2005 | Griffin et al. |
| 2005/0139397 | A1 | 6/2005 | Achilles et al. |
| 2005/0230156 | A1 | 10/2005 | Belnap et al. |
| 2005/0263328 | A1 | 12/2005 | Middlemiss |
| 2006/0060390 | A1 | 3/2006 | Eyre |
| 2006/0060391 | A1 | 3/2006 | Eyre et al. |
| 2006/0086540 | A1 | 4/2006 | Griffin et al. |
| 2006/0143991 | A1 * | 7/2006 | Sung ............................... 51/307 |
| 2006/0162969 | A1 | 7/2006 | Belnap et al. |
| 2007/0039762 | A1 | 2/2007 | Achilles |
| 2007/0163392 | A1 * | 7/2007 | Kullmann et al. .............. 76/112 |
| 2007/0181348 | A1 | 8/2007 | Lancaster et al. |
| 2007/0187155 | A1 | 8/2007 | Middlemiss |
| 2007/0266639 | A1 * | 11/2007 | Sung ............................... 51/307 |
| 2008/0289400 | A1 * | 11/2008 | Quist et al. ................... 73/54.01 |
| 2009/0090563 | A1 * | 4/2009 | Voronin et al. ............... 175/434 |
| 2010/0011673 | A1 * | 1/2010 | Shamburger ................... 51/309 |

FOREIGN PATENT DOCUMENTS

| | | |
|---|---|---|
| EP | 0329954 | 8/1989 |
| EP | 0500253 | 8/1992 |

(56) References Cited

FOREIGN PATENT DOCUMENTS

| | | |
|---|---|---|
| EP | 0585631 | 3/1994 |
| EP | 0595630 | 5/1994 |
| EP | 0612868 | 8/1994 |
| EP | 0617207 | 9/1994 |
| EP | 0787820 | 8/1997 |
| EP | 0860515 | 8/1998 |
| EP | 1190791 | 3/2002 |
| GB | 1349385 | 4/1974 |
| GB | 2048927 | 12/1980 |
| GB | 2268768 | 1/1994 |
| GB | 2323398 | 9/1998 |
| GB | 2418215 | 3/2006 |
| GB | 2422394 | 7/2006 |
| JP | 59-35066 | 2/1984 |
| JP | 61-67740 | 10/1984 |
| JP | 59-219500 | 12/1984 |
| JP | 61-125739 | 6/1986 |
| JP | 63-069971 | 9/1986 |
| JP | 63-55161 | 8/1987 |
| JP | 07-156003 | 11/1993 |
| JP | 07-62468 | 3/1995 |
| JP | 11-245103 | 9/1999 |
| JP | 2000-087112 | 3/2000 |
| RU | 2034937 | 5/1995 |
| RU | 566439 | 7/2000 |
| WO | WO-93/23204 | 11/1993 |
| WO | WO-96/34131 | 10/1996 |
| WO | WO-00/28106 | 5/2000 |
| WO | WO-2004/040095 | 5/2004 |
| WO | WO-2004/106003 | 12/2004 |
| WO | WO-2004/106004 | 12/2004 |

OTHER PUBLICATIONS

Nakamura, T. et al; Study on the Heat Deterioration Mechanism of Sintered Diamond; Program and Abstracts of the 27th High Pressure Conference of Japan; Oct. 13-15, 1986; Sapporo.

Hong, S. et al.; Dissolution Behavior of Fine Prticles of Diamond Under High Pressure Sintering Conditions; Jornal of Materials Science Letters 10; pp. 164-166; 1991.

\* cited by examiner

SUPERABRASIVE ELEMENTS INCLUDING CERAMIC COATINGS AND METHODS OF LEACHING CATALYSTS FROM SUPERABRASIVE ELEMENTS

BACKGROUND

Wear-resistant, superabrasive materials are traditionally utilized for a variety of mechanical applications. For example, polycrystalline diamond ("PCD") materials are often used in drilling tools (e.g., cutting elements, gage trimmers, etc.), machining equipment, bearing apparatuses, wire-drawing machinery, and in other mechanical systems. Other types of superabrasive materials, such as ceramics (e.g., cubic boron nitride, silicon carbide, and the like), are also utilized for similar applications.

Conventional superabrasive materials have found utility as superabrasive cutting elements in rotary drill bits, such as roller cone drill bits and fixed-cutter drill bits. A conventional cutting element typically includes a superabrasive layer or table, such as a PCD table. The PCD table is formed and bonded to a substrate using an ultra-high pressure, ultra-high temperature ("HPHT") process. The cutting element may be brazed, press-fit, or otherwise secured into a preformed pocket, socket, or other receptacle formed in the rotary drill bit. In another configuration, the substrate may be brazed or otherwise joined to an attachment member such as a stud or a cylindrical backing. Generally, a rotary drill bit may include one or more PCD cutting elements affixed to a bit body of the rotary drill bit.

Conventional superabrasive materials have also found utility as bearing elements in thrust bearing and radial bearing apparatuses. A conventional bearing element typically includes a superabrasive layer or table, such as a PCD table, bonded to a substrate. One or more bearing elements may be mounted to a bearing rotor or stator by press-fitting, brazing, or through other suitable methods of attachment. Typically, bearing elements mounted to a bearing rotor have superabrasive faces configured to contact corresponding superabrasive faces of bearing elements mounted to an adjacent bearing stator.

Superabrasive elements having a PCD table are typically fabricated by placing a cemented carbide substrate, such as a cobalt-cemented tungsten carbide substrate, into a container or cartridge with a volume of diamond particles positioned on a surface of the cemented carbide substrate. A number of such cartridges may be loaded into a HPHT press. The substrates and diamond particle volumes may then be processed under HPHT conditions in the presence of a catalyst material that causes the diamond particles to bond to one another to form a diamond table having a matrix of bonded diamond crystals. The catalyst material is often a metal-solvent catalyst, such as cobalt, nickel, and/or iron, that facilitates intergrowth and bonding of the diamond crystals.

In one conventional approach, a constituent of the cemented-carbide substrate, such as cobalt from a cobalt-cemented tungsten carbide substrate, liquefies and sweeps from a region adjacent to the volume of diamond particles into interstitial regions between the diamond particles during the HPHT process. In this example, the cobalt acts as a catalyst to facilitate the formation of bonded diamond crystals. Often, a metal-solvent catalyst may be mixed with diamond particles prior to subjecting the diamond particles and substrate to the HPHT process.

The metal-solvent catalyst may dissolve carbon from the diamond particles and portions of the diamond particles that graphitize due to the high temperatures used in the HPHT process. The solubility of the stable diamond phase in the metal-solvent catalyst may be lower than that of the metastable graphite phase under HPHT conditions. As a result of the solubility difference, the graphite tends to dissolve into the metal-solvent catalyst and the diamond tends to deposit onto existing diamond particles to form diamond-to-diamond bonds. Accordingly, diamond grains may become mutually bonded to form a matrix of polycrystalline diamond, with interstitial regions defined between the bonded diamond grains being occupied by the metal-solvent catalyst.

In addition to dissolving carbon and graphite, the metal-solvent catalyst may also carry tungsten and/or tungsten carbide from the substrate into the PCD layer. Following HPHT sintering, the tungsten and/or tungsten carbide may remain in interstitial regions defined between the bonded diamond grains.

The presence of the solvent catalyst in the diamond table is believed to reduce the thermal stability of the diamond table at elevated temperatures. For example, the difference in thermal expansion coefficient between the diamond grains and the solvent catalyst is believed to lead to chipping or cracking in the PCD table of a cutting element during drilling or cutting operations. The chipping or cracking in the PCD table may degrade the mechanical properties of the cutting element or lead to failure of the cutting element. Further, at high temperatures, diamond grains may undergo a chemical breakdown or back-conversion with the metal-solvent catalyst. Further, portions of diamond grains may transform to carbon monoxide, carbon dioxide, graphite, or combinations thereof, thereby degrading the mechanical properties of the PCD material.

Accordingly, it is desirable to remove a metal-solvent catalyst from a PCD material in situations where the PCD material may be exposed to high temperatures. Chemical leaching is often used to remove metal-solvent catalysts, such as cobalt, from regions of a PCD article that may experience high temperatures, such as regions adjacent to the working surfaces of the PCD article. Conventional chemical leaching techniques often involve the use of highly concentrated and corrosive solutions, such as highly acidic solutions, to dissolve and remove metal-solvent catalysts from polycrystalline diamond materials.

However, in addition to dissolving metal-solvent catalysts from a PCD material, leaching solutions may also dissolve portions of a substrate to which the PCD material is attached. For example, highly acidic leaching solutions may dissolve portions of a cobalt-cemented tungsten carbide substrate, causing undesired pitting and/or other corrosion of the substrate surface.

SUMMARY

The instant disclosure is directed to methods of processing polycrystalline diamond elements. According to various embodiments, such a method may comprise depositing a vaporized material over a selected portion of a polycrystalline diamond element to form a protective coating (e.g., a ceramic coating) over the selected portion. The polycrystalline diamond element may comprise a polycrystalline diamond table. The method may also comprise: 1) exposing at least a portion of the polycrystalline diamond element to a leaching solution such that the leaching solution contacts an exposed surface region of the polycrystalline diamond table and at least a portion of the protective coating and 2) removing the polycrystalline diamond element from the leaching solution. The protective coating may be substantially impermeable to the leaching solution.

In some examples, depositing the vaporized material over the selected portion of the polycrystalline diamond element may comprise depositing the vaporized material over the selected portion by at least one of physical vapor deposition, chemical vapor deposition, and hybrid physical-chemical vapor deposition. The physical vapor deposition may comprise evaporative physical vapor deposition, electron beam physical vapor deposition, sputter physical vapor deposition, cathodic arc physical vapor deposition, and/or pulsed laser physical vapor deposition. In addition, the chemical vapor deposition may comprise atmospheric pressure chemical vapor deposition, low-pressure chemical vapor deposition, high-vacuum chemical vapor deposition, aerosol assisted chemical vapor deposition, direct liquid injection chemical vapor deposition, microwave plasma-assisted chemical vapor deposition, plasma-enhanced chemical vapor deposition, atomic layer chemical vapor deposition, metalorganic chemical vapor deposition, rapid thermal chemical vapor deposition, and/or hot wire chemical vapor deposition.

In various examples, depositing the vaporized material over the selected portion of the polycrystalline diamond element may comprise depositing the vaporized material over the selected portion by electroless deposition, spraying, and/or flame-spraying. Depositing the vaporized material over the selected portion of the polycrystalline diamond element may also comprise rotating the polycrystalline diamond element relative to a vaporized material source.

In at least one example, the method may comprise drying the protective coating. The method may further comprise bonding the protective coating to the selected portion of the polycrystalline diamond element. The method may also comprise removing at least a portion of the protective coating from the polycrystalline diamond element. The method may additionally comprise surrounding at least a portion of the protective coating with a substantially inert layer In some examples, the protective coating may have a thickness of between approximately 1 and 10 μm. In one example, the polycrystalline diamond element may further comprise a substrate bonded to the polycrystalline diamond table. In this example, the selected portion may comprise at least a portion of a surface of the polycrystalline diamond table and at least a portion of a surface of the substrate.

In at least one embodiment, the method may comprise forming a ceramic coating over a selected portion of the polycrystalline diamond element. The ceramic coating may comprise a nitride material and/or a carbide material (e.g., TiN, CrN, TiAlN, CrC, AlTiN, ZrN, TiCN, etc.).

Features from any of the described embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The instant disclosure is directed to superabrasive articles, such as superabrasive cutting elements and superabrasive bearing elements. As used herein, the terms "superabrasive" and "superhard" may refer to materials exhibiting a hardness exceeding a hardness of tungsten carbide. For example, a superabrasive article may represent an article of manufacture, at least a portion of which may exhibit a hardness exceeding the hardness of tungsten carbide. The superabrasive articles disclosed herein may be used in a variety of applications, such as drilling tools (e.g., compacts, cutting elements, gage trimmers, etc.), machining equipment, bearing apparatuses, wire-drawing machinery, and other apparatuses. The instant disclosure is also directed to methods of processing superabrasive articles.

Figure 1:
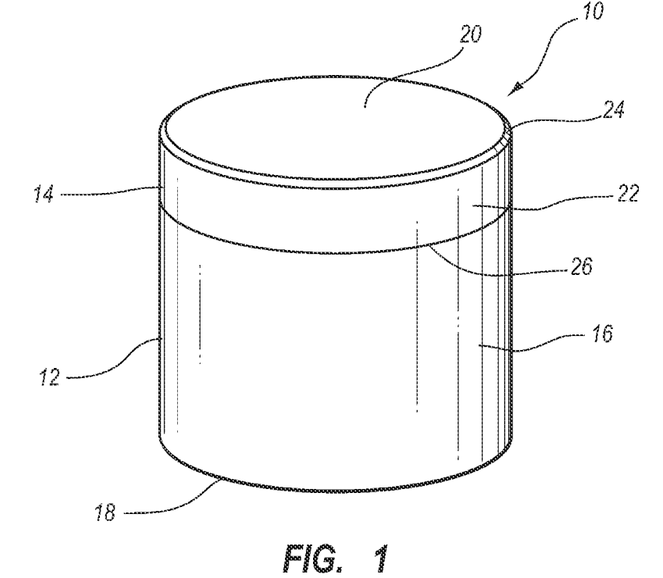
FIG. 1 is a perspective view of an exemplary superabrasive element according to at least one embodiment.

FIG. 1 is a perspective view of an exemplary superabrasive element 10 according to at least one embodiment. As illustrated in FIG. 1, superabrasive element 10 may comprise a layer or superabrasive table 14 affixed to or formed upon a substrate 12. Superabrasive table 14 may be affixed to substrate 12 at interface 26. Superabrasive element 10 may comprise a rear face 18 and a substrate side surface 16 formed by substrate 12. Superabrasive element 10 may also comprise a superabrasive face 20, a superabrasive side surface 22, and a superabrasive edge 24 formed by superabrasive table 14. Superabrasive edge 24 may comprise an angular or rounded edge formed at the intersection of superabrasive side surface 22 and superabrasive face 20. In some embodiments, superabrasive edge 24 may comprise a chamfered surface extending between superabrasive side surface 22 and superabrasive face 20.

Substrate 12 may comprise any suitable material on which superabrasive table 14 may be formed. In at least one embodiment, substrate 12 may comprise a cemented carbide material, such as a cobalt-cemented tungsten carbide material or any other suitable material. Further, substrate 12 may include a suitable metal-solvent catalyst material, such as, for example, cobalt, nickel, iron, and/or alloys thereof. Substrate 12 may also include any other suitable material including, without limitation, cemented carbides such as titanium carbide, niobium carbide, tantalum carbide, vanadium carbide, chromium carbide, and/or combinations of any of the preceding carbides cemented with iron, nickel, cobalt, and/or alloys thereof.

Superabrasive table 14 may be formed of any suitable superabrasive and/or superhard material or combination of materials, including, for example PCD. According to some embodiments, superabrasive table 14 may comprise cubic boron nitride, silicon carbide, diamond, and/or mixtures or composites including one or more of the foregoing materials.

Superabrasive table 14 may be formed using any suitable technique. For example, superabrasive table 14 may comprise a PCD layer formed by subjecting a plurality of diamond particles (e.g., diamond particles having an average particle size between approximately 0.5 µm and approximately 150 µm) to a HPHT sintering process in the presence of a metal-solvent catalyst, such as cobalt, nickel, iron, and/or any other suitable group VIII element. During a HPHT sintering process, adjacent diamond crystals in a mass of diamond particles may become bonded to one another, forming a PCD table comprising bonded diamond crystals. In one example, diamond crystals in superabrasive table 14 may have an average grain size of approximately 20 µm or less. Further, during a HPHT sintering process, diamond grains may become bonded to an adjacent substrate 12 at interface 26.

According to various embodiments, superabrasive table 14 may be formed by placing diamond particles adjacent to a substrate 12 comprising cemented tungsten carbide. The resulting sintered PCD layer may include various interstitial materials, including, for example, cobalt, tungsten, and/or tungsten carbide. For example, tungsten and/or tungsten carbide may be swept into the PCD layer from substrate 12 during HPHT sintering. In some examples, a liquefied metal-solvent catalyst from substrate 12 (e.g., cobalt from a cobalt-cemented tungsten carbide substrate) may dissolve and carry tungsten and/or tungsten carbide from substrate 12 into a diamond mass used to form superabrasive table 14 during HPHT sintering. Tungsten and/or tungsten carbide particles may also be intentionally mixed with diamond particles prior to forming superabrasive table 14.

Figure 2:
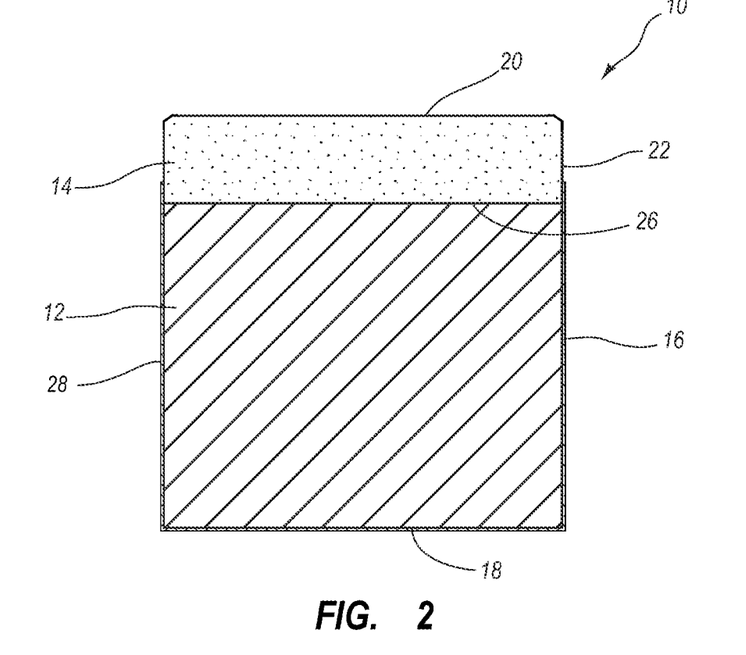
FIG. 2 is a cross-sectional side view of an exemplary superabrasive element that is at least partially surrounded by a coating according to at least one embodiment.

FIG. 2 is a cross-sectional side view of an exemplary superabrasive element 10 that is at least partially surrounded by a coating 28 according to at least one embodiment. As shown in FIG. 2, coating 28 may be disposed on at least a portion of superabrasive element 10. For example, coating 28 may be disposed on substrate 12 such that coating 28 covers substantially all exposed surface portions of substrate 12. In some examples, coating 28 may cover a portion of superabrasive table 14. Coating 28 may comprise any material suitable for protecting substrate 12 by preventing or inhibiting corrosion of substrate 12 during leaching of superabrasive element 10, including, without limitation, a ceramic material or other suitable coating material. In at least one example, a suitable ceramic material may include, for example, TiN, CrN, TiAlN, CrC, AlTiN, ZrN, and/or TiCN.

Coating 28 may be coated onto portions of superabrasive element 10 using any suitable coating technique, without limitation. In at least one embodiment, coating 28 may be coated onto portions of superabrasive element 10 using a suitable physical vapor deposition ("PVD") process. In a PVD process, a material used to form coating 28 may be vaporized and deposited onto surface portions of superabrasive element 10. Examples of suitable PVD processes include, for example, evaporative PVD, electron beam PVD, sputter PVD, cathodic arc PVD, and/or pulsed laser PVD.

A PVD process may be conducted at relatively low temperatures of about 500° C. or less. During a PVD process, superabrasive element 10 may be rotated relative to a source generating the vaporized material to obtain a relatively even or complete coating on coated portions of superabrasive element 10. Coating 28 may exhibit a desired thickness.

In some embodiments, coating 28 may be coated onto portions of superabrasive element 10 using a suitable chemical vapor deposition ("CVD") process. In a CVD process, one or more volatile reagents may be vaporized and heated and portions of superabrasive element 10 may be exposed to the vaporized reagents. The vaporized reagents may react and/or decompose on surface portions of superabrasive element 10, forming a coating on the surface portions. Examples of suitable CVD processes include, without limitation, atmospheric pressure CVD, low-pressure CVD, high-vacuum CVD, aerosol assisted CVD, direct liquid injection CVD, microwave plasma-assisted CVD, plasma-enhanced CVD, atomic layer CVD, metalorganic CVD, rapid thermal CVD, and/or hot wire CVD.

In some examples, a CVD process may be conducted at relatively high temperatures of about 1300° C. or less. The CVD process may produce a relatively even coating on coated portions of superabrasive element 10. A hybrid physical-chemical vapor deposition process may also be used to coat portions of superabrasive element 10. In at least one embodiment, at least a portion of superabrasive element 10 may be coated using an electroless deposition technique, in which coating 28 is deposited on a conductive surface portion of superabrasive element 10. In various embodiments, coating 28 may be sprayed and/or flame sprayed onto a surface of superabrasive element 10.

In some embodiments, after coating 28 is applied to at least a portion of superabrasive element 10, coating 28 may be dried to form a solid or relatively solid coating. For example, coating 28 may be applied to superabrasive element 10 as a liquid composition, and coating 28 may be dried using any suitable drying technique, without limitation. In various examples, coating 28 may be applied to superabrasive element 10 in such a manner that coating 28 comprises a relatively solid coating layer upon or immediately following deposition on superabrasive element 10.

According to at least one embodiment, coating 28 may be bonded and/or otherwise adhered to at least a portion of substrate 12 and/or superabrasive table 14. For example, coating 28 may be bonded to superabrasive element 10 as coating 28 is applied to at least a portion of superabrasive element 10. In various embodiments, coating 28 may be adhered to superabrasive element 10 after coating 28 is applied to at least a portion of superabrasive element 10. For example, coating 28 may be heated, dried, and/or subjected to any other suitable conditions resulting in coating 28 becoming adhered to superabrasive element 10.

Coating 28 may be formed to any suitable thickness. In various embodiments, coating 28 may be formed to a thickness that prevents a leaching solution from coming into contact with portions of superabrasive element 10, such as substrate 12, during leaching of superabrasive table 14. Accordingly, coating 28 may protect substrate 12 from pitting and other corrosion due to exposure to a leaching solution.

Coating 28 may be formed to a thickness that facilitates suitable adhesion of coating 28 to portions of superabrasive element 10. Optionally, coating 28 may have a relatively even thickness on coated portions of superabrasive element 10. In some examples, coating 28 may have a thickness of less than approximately 6 µm. In additional examples, coating 28 may have a thickness of between approximately 1 and 10 µm. In at least one example, coating 28 may have a thickness of between approximately 2 and 3 µm.

Coating 28 may comprise one or more layers of material. In some examples, coating 28 may comprise multiple layers of coating material. The multiple layers of coating material may comprise one or more coating materials. For example, various layers of material in coating 28 may comprise different materials. In at least one embodiment, the multiple layers in coating 28 may be formed at different times. For example, a first coating layer may be formed directly on at least a portion of substrate 12 and/or superabrasive table 14. Subsequently, a second coating layer may be formed on the first coating layer. The first coating layer and the second coating layer may be formed of relatively the same materials. In some embodiments, the first coating layer and the second coating layer may be formed of different materials. In various embodiments, additional coating layers formed of relatively the same and/or different materials as the first coating layer and the second coating layer may also be formed.

Figure 3:
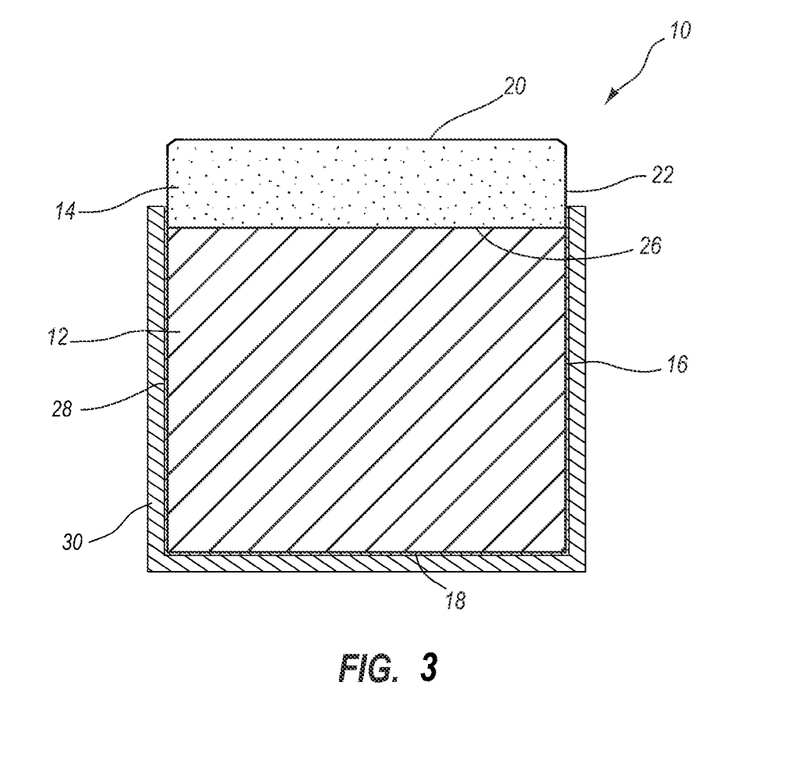
FIG. 3 is cross-sectional side view of the exemplary superabrasive element illustrated in FIG. 2.

FIG. 3 is cross-sectional side view of the exemplary superabrasive element 10 illustrated in FIG. 2 according to some embodiments. As illustrated in FIG. 3, superabrasive element 10 may be at least partially surrounded by a protective layer 30. Protective layer 30 may comprise a substantially inert material. In some examples, protective layer 30 may comprise a substantially inert cup, such as, for example, a polytetrafluoroethylene ("PTFE") cup.

The inert cup may be sized to fit tightly around and cover at least a portion of substrate 12. In some embodiments, as illustrated in FIG. 3, the inert cup may be configured to fit around substrate 12 that is coated with coating 28. In some examples, protective layer 30 may also cover at least a portion of superabrasive table 14. Protective layer 30 may prevent or reduce an amount of leaching solution coming into contact with coating 28 and/or substrate 12 during leaching of superabrasive table 14.

A superabrasive element 10 that is at least partially coated with coating 28 and/or protective layer 30 may be exposed to a leaching solution used in leaching various materials from superabrasive table 14. In at least one example, a corrosive leaching solution may be used to remove a metal-solvent catalyst from interstitial spaces between diamond grains in superabrasive table 14. According to various embodiments, the leaching solution may comprise various solvents, acids, and/or other suitable reagents, including, without limitation, water, peroxide, nitric acid, hydrofluoric acid, and/or hydrochloric acid. Superabrasive element 10 may be exposed to the leaching solution for any suitable period of time. For example, superabrasive element 10 may be exposed to the leaching solution until various interstitial materials, such as, for example, a metal-solvent catalyst, are removed from superabrasive table 14 to a desired depth.

Although small amounts of leaching solution may seep between protective layer 30 and coating 28 during leaching of superabrasive element 10, the rate of corrosion of coating 28 due to the leaching solution may be reduced in comparison with a superabrasive element 10 that does not include protective layer 30. Protective layer 30 may therefore inhibit the leaching solution from chemically corroding coating 28 and/or substrate 12. Accordingly, a superabrasive element 10 that includes a protective layer 30 and a coating 28 may be exposed to a leaching solution for relatively longer periods of time and/or may be exposed to relatively stronger leaching solutions than conventional superabrasive elements.

Following leaching of superabrasive table 14, protective layer 30 may be removed from superabrasive element 10. Further, coating 28 may be removed from superabrasive element 10 following leaching. Coating 28 may be removed using any suitable material removal technique including, without limitation, CG-grinding, chemical sand blasting, and/or bead blasting. According to various embodiments, a chamfered cutting edge 24 (e.g., chamfered cutting edge 24 in FIG. 1) may be formed prior to or following leaching. In at least one example, chamfered cutting edge 24 may be formed using the same material removal technique used to remove coating 28.

Figure 4:
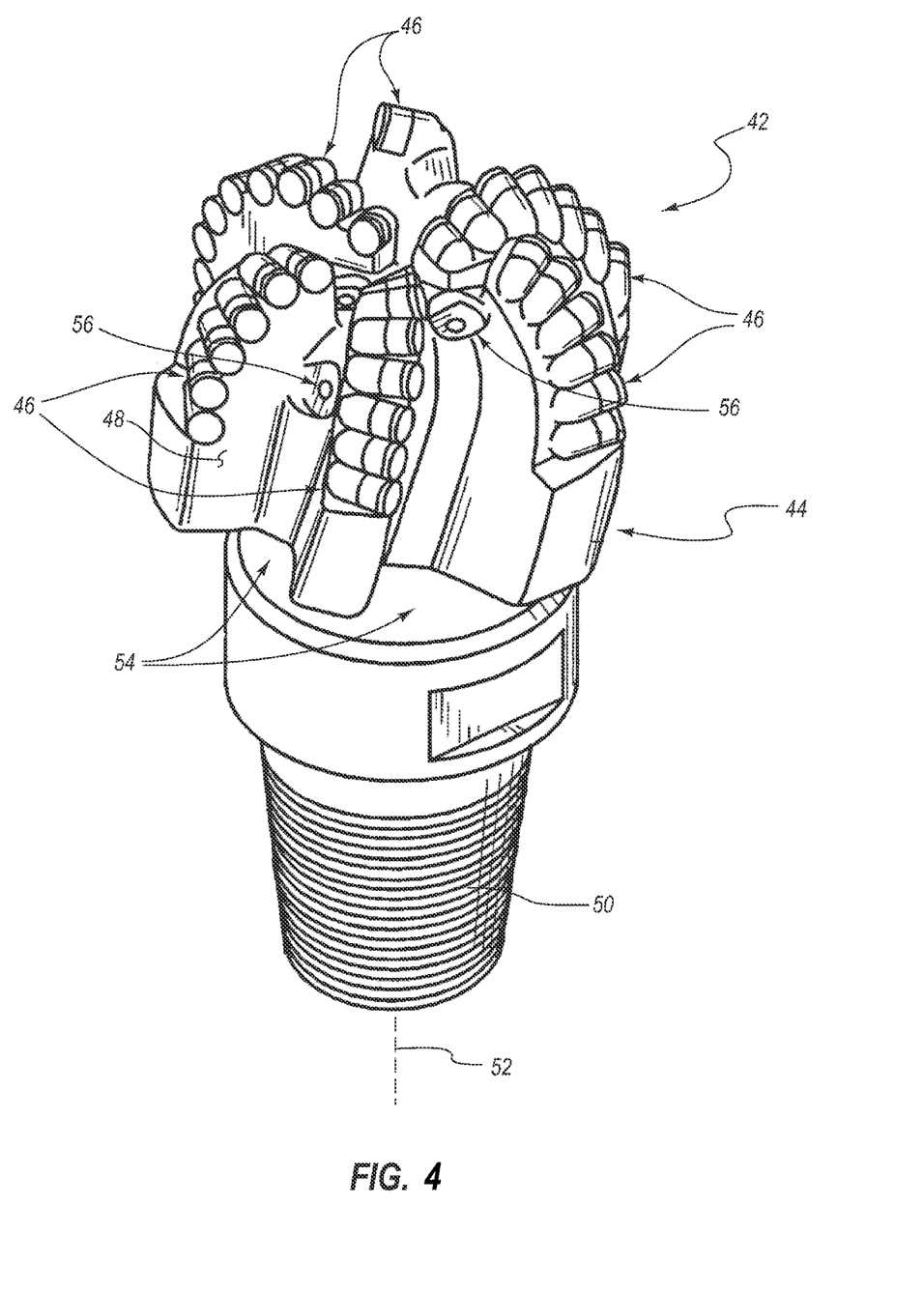
FIG. 4 is a perspective view of an exemplary drill bit according to at least one embodiment.
Figure 5:
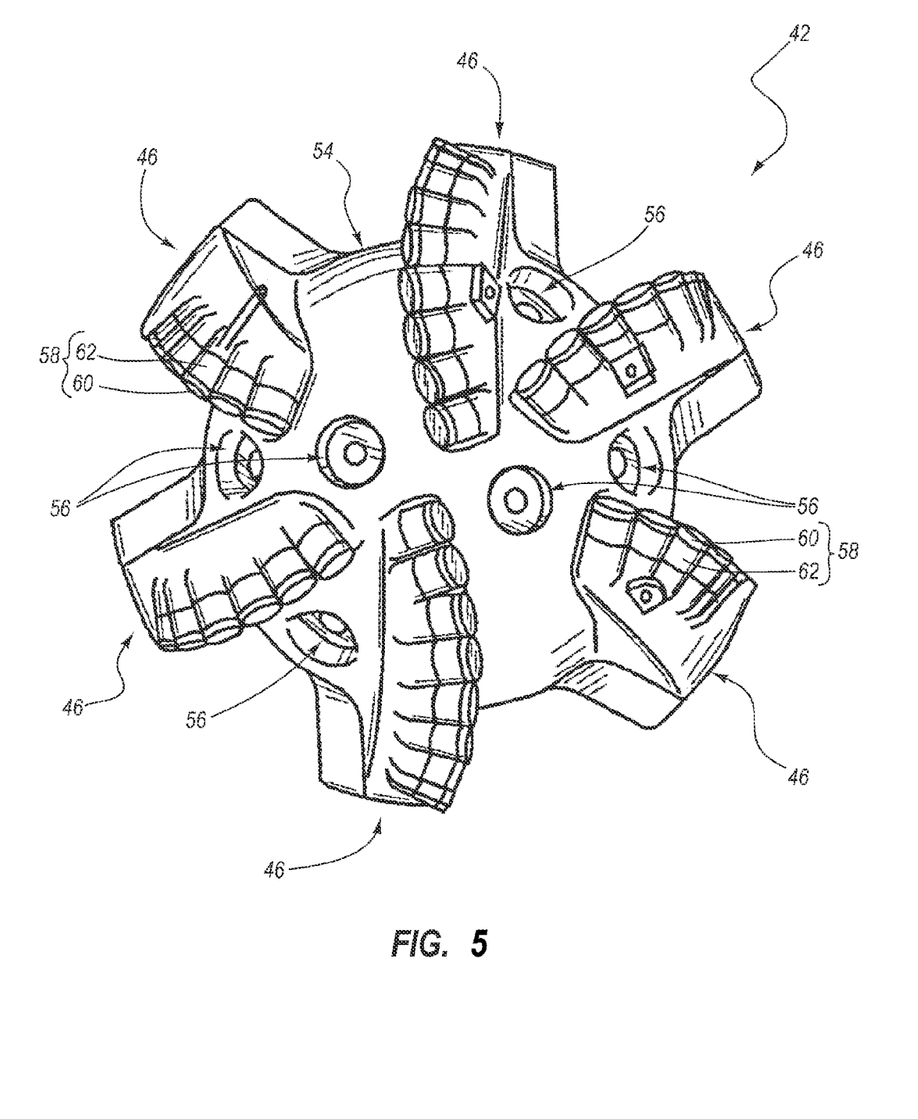
FIG. 5 is a top view of the exemplary drill bit illustrated in FIG. 4.

FIGS. 4 and 5 are a perspective view and a top view, respectively, of an exemplary drill bit 42 according to at least one embodiment. Drill bit 42 may represent any type or form of earth-boring or drilling tool, including, for example, a rotary drill bit.

As illustrated in FIGS. 4 and 5, drill bit 42 may comprise a bit body 44 having a longitudinal axis 52. Bit body 44 may define a leading end structure for drilling into a subterranean formation by rotating bit body 44 about longitudinal axis 52 and applying weight to bit body 44. Bit body 44 may include radially and longitudinally extending blades 46 with leading faces 48 and a threaded pin connection 50 for connecting bit body 44 to a drill string.

At least one cutting element 58 may be coupled to bit body 44. For example, as shown in FIGS. 4 and 5, a plurality of cutting elements 58 may be coupled to blades 46. Cutting elements 58 may comprise any suitable superabrasive cutting elements, without limitation. In at least one embodiment, cutting elements 58 may be configured according to previously described superabrasive element 10. For example, each cutting element 58 may include a superabrasive table 60, such as a PCD table, bonded to a substrate 62.

Circumferentially adjacent blades 46 may define so-called junk slots 54 therebetween. Junk slots 54 may be configured to channel debris, such as rock or formation cuttings, away from cutting elements 58 during drilling. Rotary drill bit 42 may also include a plurality of nozzle cavities 56 for communicating drilling fluid from the interior of rotary drill bit 42 to cutting elements 58.

Figure 6:
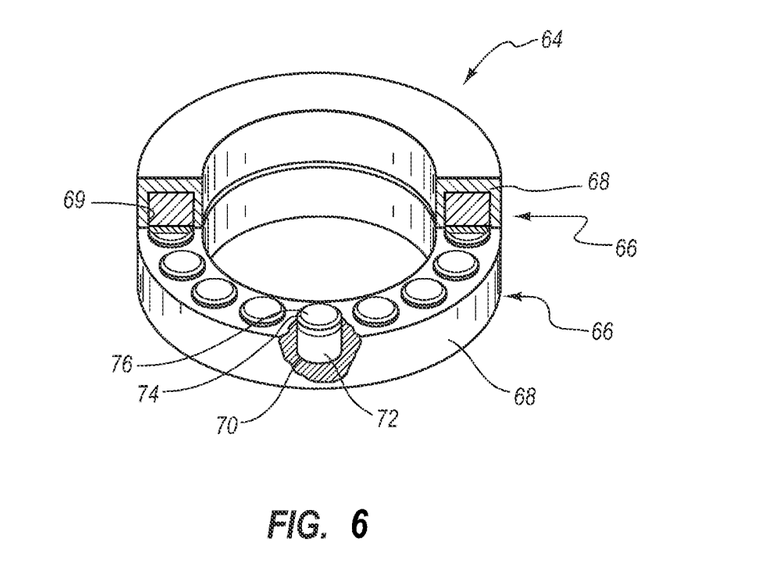
FIG. 6 is a partial cut-away perspective view of an exemplary thrust bearing apparatus according to at least one embodiment.
Figure 7:
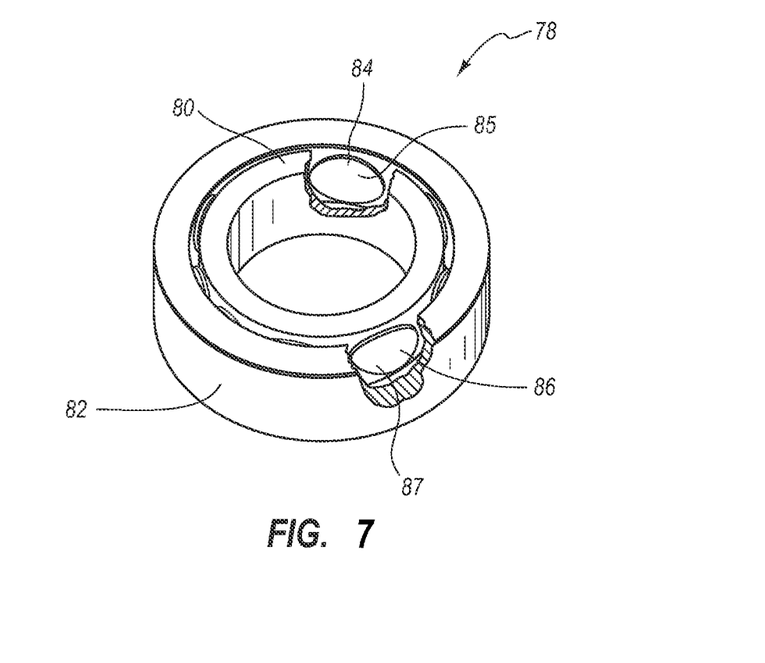
FIG. 7 is a partial cut-away perspective view of an exemplary radial bearing apparatus according to at least one embodiment.

FIGS. 6 and 7 depict an example of a rotary drill bit 42 that employs at least one cutting element 58 comprising a superabrasive table 60 fabricated and structured in accordance with the disclosed embodiments, without limitation. Rotary drill bit 42 may optionally represent any number of earth-boring tools or drilling tools, including, for example, core bits, roller-cone bits, fixed-cutter bits, eccentric bits, bicenter bits, reamers, reamer wings, or any other downhole tool including superabrasive cutting elements and discs, without limitation.

The superabrasive elements and discs disclosed herein may also be utilized in applications other than cutting technology. For example, embodiments of superabrasive elements disclosed herein may also form all or part of heat sinks, wire dies, bearing elements, cutting elements, cutting inserts (e.g., on a roller cone type drill bit), machining inserts, or any other article of manufacture as known in the art. Thus, superabrasive elements and discs, as disclosed herein, may be employed in any suitable article of manufacture that includes a superabrasive element, disc, or layer. Other examples of articles of manufacture that may incorporate superabrasive elements as disclosed herein may be found in U.S. Pat. Nos. 4,811,801; 4,268,276; 4,468,138; 4,738,322; 4,913,247;

5,016,718; 5,092,687; 5,120,327; 5,135,061; 5,154,245; 5,460,233; 5,544,713; and 6,793,681, the disclosure of each of which is incorporated herein, in its entirety, by this reference.

In some embodiments, a rotor and a stator, such as a rotor and a stator used in a thrust bearing apparatus, may each include at least one superabrasive element according to the embodiments disclosed herein. For example, U.S. Pat. Nos. 4,410,054; 4,560,014; 5,364,192; 5,368,398; and 5,480,233, the disclosure of each of which is incorporated herein, in its entirety, by this reference, disclose subterranean drilling systems that include bearing apparatuses utilizing superabrasive elements as disclosed herein.

FIG. 6 is partial cut-away perspective view of an exemplary thrust-bearing apparatus 64 according to at least one embodiment. Thrust-bearing apparatus 64 may utilize any of the disclosed superabrasive element embodiments as bearing elements 70. Thrust-bearing apparatus 64 may also include bearing assemblies 66. Each bearing assembly 66 may include a support ring 68 fabricated from a material, such as steel, stainless steel, or any other suitable material, without limitation.

Each support ring 68 may include a plurality of recesses 69 configured to receive corresponding bearing elements 70. Each bearing element 70 may be mounted to a corresponding support ring 68 within a corresponding recess 69 by brazing, welding, press-fitting, using fasteners, or any another suitable mounting technique, without limitation. One or more of bearing elements 70 may be configured in accordance with any of the disclosed superabrasive element embodiments. For example, each bearing element 70 may include a substrate 72 and a superabrasive table 74 comprising a PCD material. Each superabrasive table 74 may form a bearing surface 76.

Bearing surfaces 76 of one bearing assembly 66 may bear against opposing bearing surfaces 76 of a corresponding bearing assembly 66 in thrust-bearing apparatus 64, as illustrated in FIG. 6. For example, a first bearing assembly 66 of thrust-bearing apparatus 64 may be termed a "rotor." The rotor may be operably coupled to a rotational shaft. A second bearing assembly 66 of thrust-bearing apparatus 64 may be held substantially stationary relative to the first bearing assembly 66 and may be termed a "stator."

FIG. 7 is a partial cut-away perspective view of a radial bearing apparatus 78 according to another embodiment. Radial bearing apparatus 78 may utilize any of the disclosed superabrasive element embodiments as bearing elements 84 and 86. Radial bearing apparatus 78 may include an inner race 80 positioned generally within an outer race 82. Inner race 80 may include a plurality of bearing elements 84 affixed thereto, and outer race 80 may include a plurality of corresponding bearing elements 86 affixed thereto. One or more of bearing elements 84 and 86 may be configured in accordance with any of the superabrasive element embodiments disclosed herein.

Inner race 80 may be positioned generally within outer race 82. Thus, inner race 80 and outer race 82 may be configured such that bearing surfaces 85 defined by bearing elements 84 and bearing surfaces 87 defined by bearing elements 86 may at least partially contact one another and move relative to one another as inner race 80 and outer race 82 rotate relative to each other. According to various embodiments, thrust-bearing apparatus 64 and/or radial bearing apparatus 78 may be incorporated into a subterranean drilling system.

Figure 8:
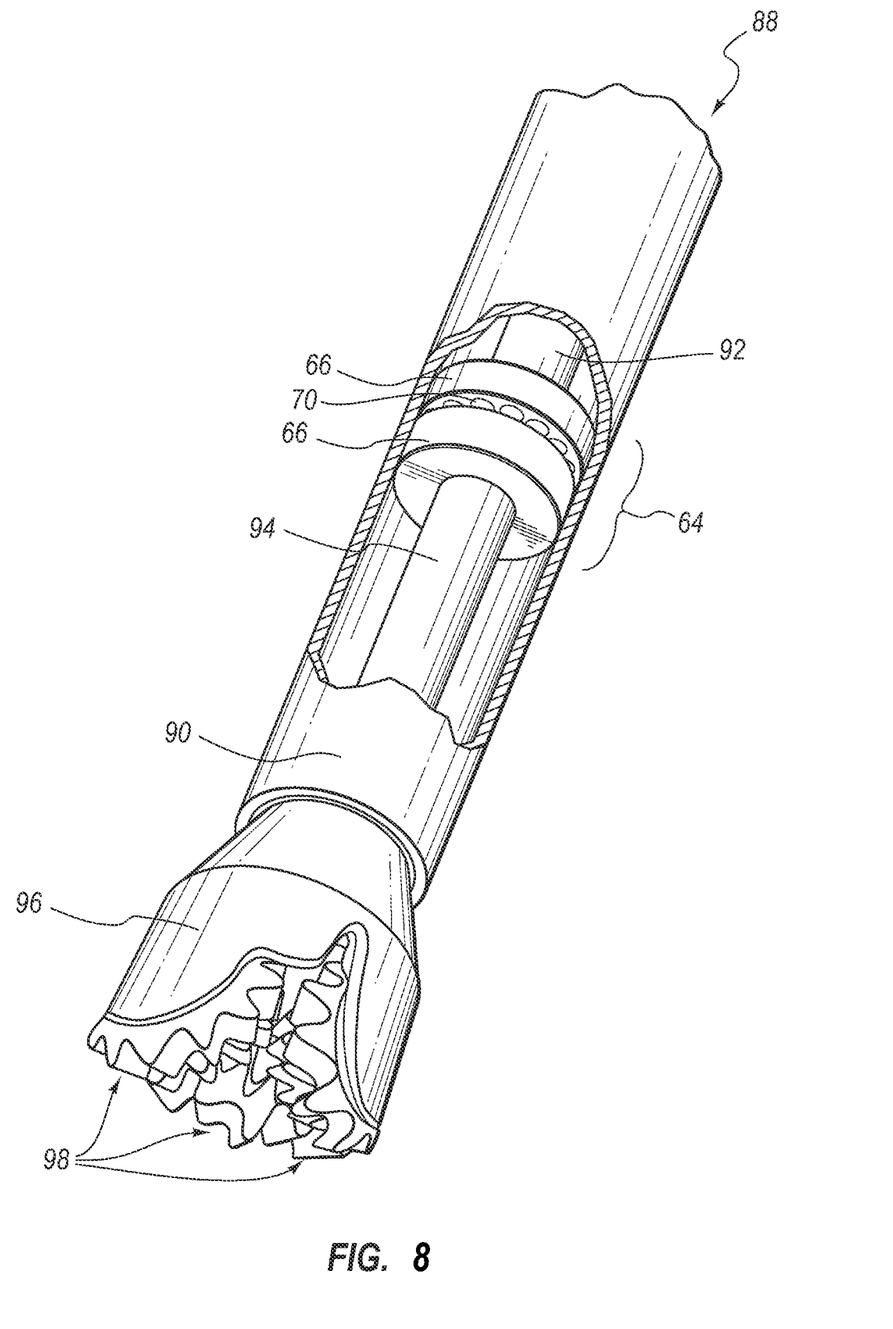
FIG. 8 is a partial cut-away perspective view of an exemplary subterranean drilling system according to at least one embodiment.

FIG. 8 is a partial cut-away perspective view of an exemplary subterranean drilling system 88 that includes a thrust-bearing apparatus 64 according to at least one embodiment. The subterranean drilling system 88 may include a housing 90 enclosing a downhole drilling motor 92 (i.e., a motor, turbine, or any other suitable device capable of rotating an output shaft, without limitation) that is operably connected to an output shaft 94.

The thrust-bearing apparatus 64 shown in FIG. 8 may be operably coupled to downhole drilling motor 92. A rotary drill bit 96, such as a rotary drill bit configured to engage a subterranean formation and drill a borehole, may be connected to output shaft 94. As illustrated in FIG. 8, rotary drill bit 96 may be a roller cone bit comprising a plurality of roller cones 98. According to some embodiments, rotary drill bit 96 may comprise any suitable type of rotary drill bit, such as, for example, a so-called fixed-cutter drill bit. As a borehole is drilled using rotary bit 96, pipe sections may be connected to subterranean drilling system 88 to form a drill string capable of progressively drilling the borehole to a greater depth within a subterranean formation.

A first thrust-bearing assembly 66 in thrust-bearing apparatus 64 may be configured as a rotor that is attached to output shaft 94 and a second thrust-bearing assembly 66 in thrust-bearing apparatus 64 may be configured as a stator. During a drilling operation using subterranean drilling system 88, the rotor may rotate in conjunction with output shaft 94 and the stator may remain substantially stationary relative to the rotor.

According to various embodiments, drilling fluid may be circulated through downhole drilling motor 92 to generate torque and effect rotation of output shaft 94 and rotary drill bit 96 attached thereto so that a borehole may be drilled. A portion of the drilling fluid may also be used to lubricate opposing bearing surfaces of bearing elements 70 on thrust-bearing assemblies 66.

Figure 9:
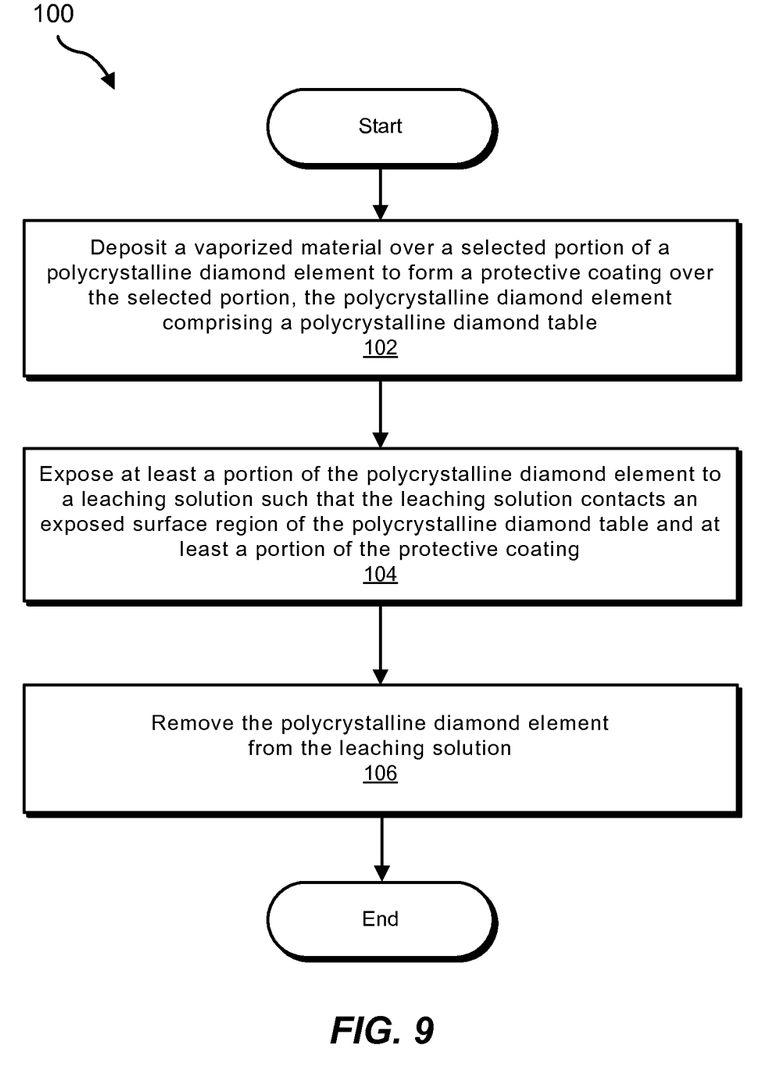
FIG. 9 is a flow diagram of an exemplary method of processing a superabrasive element according to at least one embodiment.

FIG. 9 illustrates an exemplary method 100 of processing a polycrystalline diamond element according to at least one embodiment. As shown in FIG. 9, at step 102 a vaporized material may be deposited over a selected portion of a polycrystalline diamond element (e.g., superabrasive element 10 illustrated in FIG. 2) to form a protective coating (e.g., coating 28 illustrated in FIG. 2) over the selected portion. The polycrystalline diamond element may comprise a polycrystalline diamond table (e.g., superabrasive table 14 illustrated in FIG. 2). In some examples, the polycrystalline diamond table may be bonded to a suitable substrate (e.g., substrate 12 illustrated in FIG. 2), such as, for example, a tungsten carbide substrate. In various embodiments, the protective coating may also be formed on at least a portion of the polycrystalline diamond table and/or at least a portion of the substrate. The polycrystalline diamond element may be rotated relative to a vaporized material source during deposition.

The vaporized material may be deposited over the selected portion of the polycrystalline diamond table using any suitable coating technique, including, for example, physical vapor deposition and/or chemical vapor deposition. The physical vapor deposition may comprise evaporative physical vapor deposition, electron beam physical vapor deposition, sputter physical vapor deposition, cathodic arc physical vapor deposition, and/or pulsed laser physical vapor deposition.

The chemical vapor deposition may comprise atmospheric pressure chemical vapor deposition, low-pressure chemical vapor deposition, high-vacuum chemical vapor deposition, aerosol assisted chemical vapor deposition, direct liquid injection chemical vapor deposition, microwave plasma-assisted chemical vapor deposition, plasma-enhanced chemical vapor deposition, atomic layer chemical vapor deposition, metalorganic chemical vapor deposition, rapid thermal chemical vapor deposition, and/or hot wire chemical vapor deposition. In some examples, the vaporized material may be deposited over the selected portion of the polycrystalline diamond element by electroless deposition, spraying, and/or flame-spraying.

The protective coating may include any suitable material or combination of materials, including, for example, a ceramic material such as a nitride and/or a carbide material (e.g., TiN, CrN, TiAlN, CrC, AlTiN, ZrN, TiCN, etc.). According to at least one embodiment, the protective coating may be bonded and/or otherwise adhered to at least a portion of the substrate and/or the polycrystalline diamond table. The protective coating may also be dried after it is formed over the selected portion of the polycrystalline diamond element.

At least a portion of the substrate may also be surrounded with a substantially inert layer (e.g., protective layer 30 illustrated in FIG. 3). For example, an inert PTFE cup may be placed around the polycrystalline diamond element so that the cup surrounds at least a portion of the substrate. The substantially inert layer may also surround at least a portion of the coating disposed on the polycrystalline diamond element. In at least one embodiment, the inert layer may comprise a preformed layer of material, such as a cup, that is configured to closely surround at least a portion of the substrate, polycrystalline diamond table, and/or coating disposed on the polycrystalline diamond element. In at least one example, the inert layer may be formed such that it surrounds and/or frictionally engages an outer portion of the polycrystalline diamond element and/or coating. In some embodiments, the inert layer may be adhered to an outer portion of the polycrystalline diamond element and/or coating using, for example, an adhesive.

At step 104, at least a portion of the polycrystalline diamond element may be exposed to a leaching solution such that the leaching solution contacts an exposed surface region of the polycrystalline diamond table and at least a portion of the protective coating. According to various embodiments, the leaching solution may comprise various solvents, acids, and/or other suitable reagents, including, without limitation, water, peroxide, nitric acid, hydrofluoric acid, and/or hydrochloric acid. The polycrystalline diamond element may be exposed to the leaching solution in any suitable manner. For example, the polycrystalline diamond element may be at least partially submerged in the leaching solution. The polycrystalline diamond element may be exposed to the leaching solution until the polycrystalline diamond table is leached to a sufficient depth. The coating may inhibit corrosion of the substrate during leaching, thereby preventing pitting of the substrate.

At step 106, the polycrystalline diamond element may be removed from the leaching solution. For example, the polycrystalline diamond element may be removed from the leaching solution once the polycrystalline diamond table has been leached to a desired depth. Once the polycrystalline diamond element has been removed from the leaching solution, the protective coating may also be removed from the substrate. The coating may be removed using any suitable technique including, without limitation, CG-grinding, chemically sand blasting, and/or bead blasting. According to various embodiments, a chamfered cutting edge may be formed on the polycrystalline diamond table following leaching. For example, the chamfered cutting edge may be formed using the same technique used to remove the coating.

Figure 10:
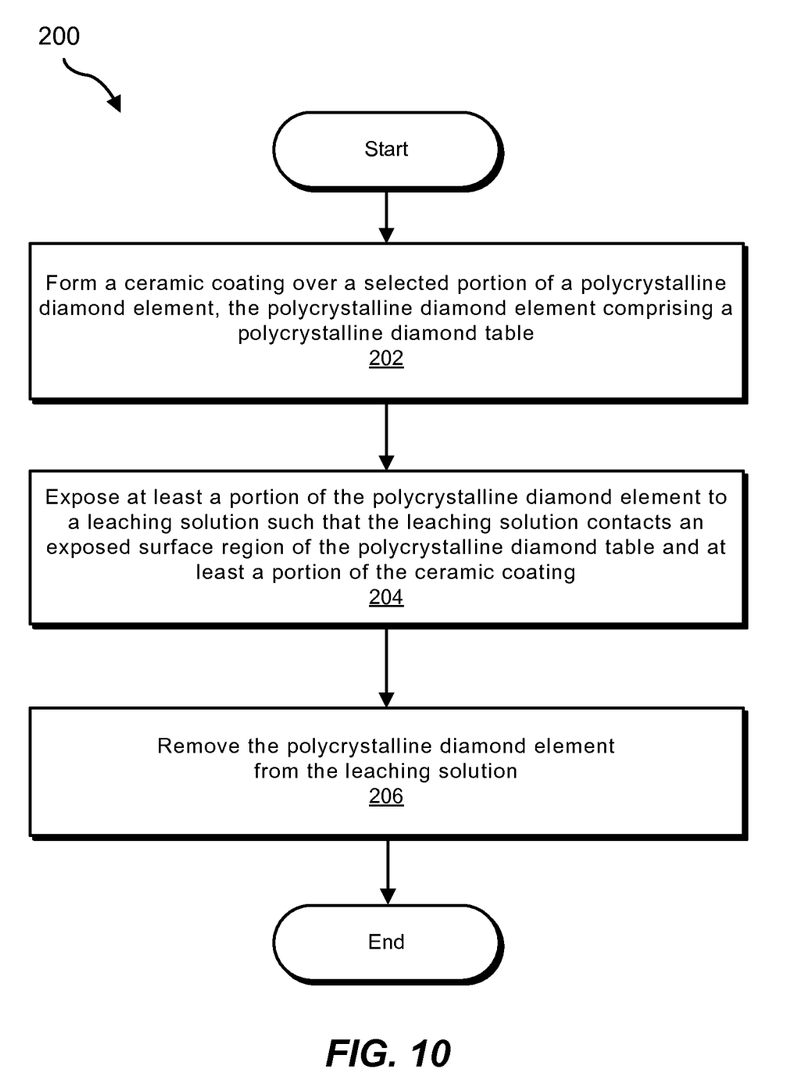
FIG. 10 is a flow diagram of an exemplary method of processing a superabrasive element according to further embodiments.

FIG. 10 illustrates an exemplary method 200 of processing a polycrystalline diamond element according to some embodiments. As shown in FIG. 10, at step 202 a ceramic coating may be formed over a selected portion of a polycrystalline diamond element comprising a polycrystalline diamond table. At step 204, at least a portion of the polycrystalline diamond element may be exposed to a leaching solution such that the leaching solution contacts an exposed surface region of the polycrystalline diamond table and at least a portion of the ceramic coating. At step 206, the polycrystalline diamond element may be removed from the leaching solution.

The preceding description has been provided to enable others skilled in the art to best utilize various aspects of the exemplary embodiments described herein. This exemplary description is not intended to be exhaustive or to be limited to any precise form disclosed. Many modifications and variations are possible without departing from the spirit and scope of the instant disclosure. It is desired that the embodiments described herein be considered in all respects illustrative and not restrictive and that reference be made to the appended claims and their equivalents for determining the scope of the instant disclosure.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising."

What is claimed is:

1. A method of processing a polycrystalline diamond element, comprising: depositing a vaporized material over a selected portion of a polycrystalline diamond element to form a protective coating over the selected portion, the polycrystalline diamond element comprising a polycrystalline diamond table bonded to a cemented carbide substrate, the protective coating comprising a ceramic material: exposing at least a portion of the polycrystalline diamond element to a leaching solution such that the leaching solution contacts an exposed surface region of the polycrystalline diamond table and at least a portion of the protective coating; removing the polycrystalline diamond element from the leaching solution; wherein the protective coating is substantially impermeable with the leaching solution.

2. The method of claim 1, wherein depositing the vaporized material over the selected portion of the polycrystalline diamond element comprises depositing the vaporized material over the selected portion by at least one of physical vapor deposition, chemical vapor deposition, and hybrid physical-chemical vapor deposition.

3. The method of claim 2, wherein the physical vapor deposition comprises at least one of evaporative physical vapor deposition, electron beam physical vapor deposition, sputter physical vapor deposition, cathodic arc physical vapor deposition, and pulsed laser physical vapor deposition.

4. The method of claim 2, wherein the chemical vapor deposition comprises at least one of atmospheric pressure chemical vapor deposition, low-pressure chemical vapor deposition, high-vacuum chemical vapor deposition, aerosol assisted chemical vapor deposition, direct liquid injection chemical vapor deposition, microwave plasma-assisted chemical vapor deposition, plasma-enhanced chemical vapor deposition, atomic layer chemical vapor deposition, metalorganic chemical vapor deposition, rapid thermal chemical vapor deposition, and hot wire chemical vapor deposition.

5. The method of claim 1, wherein depositing the vaporized material over the selected portion of the polycrystalline diamond element comprises depositing the vaporized material over the selected portion by at least one of electroless deposition, spraying, and flame-spraying.

6. The method of claim 1, wherein depositing the vaporized material over the selected portion of the polycrystalline diamond element comprises rotating the polycrystalline diamond element relative to a vaporized material source.

7. The method of claim 1, further comprising drying the protective coating.

8. The method of claim 1, further comprising bonding the protective coating to the selected portion of the polycrystalline diamond element.

9. The method of claim 1, further comprising removing at least a portion of the protective coating from the polycrystalline diamond element.

10. The method of claim 1, wherein the protective coating has a thickness of between approximately 1 and 10 μm.

11. The method of claim 1, further comprising surrounding at least a portion of the protective coating with a substantially inert layer.

12. The method of claim 1, wherein:
the selected portion comprises at least a portion of a surface of the polycrystalline diamond table and at least a portion of a surface of the substrate.

13. A method of processing a polycrystalline diamond element, comprising:
sintering a polycrystalline diamond element comprising a polycrystalline diamond table bonded to a cemented carbide substrate;
forming a ceramic coating over a selected portion of the polycrystalline diamond element subsequent to sintering the polycrystalline diamond element;
exposing at least a portion of the polycrystalline diamond element to a leaching solution such that the leaching solution contacts an exposed surface region of the polycrystalline diamond table and at least a portion of the ceramic coating;
removing the polycrystalline diamond element from the leaching solution.

14. The method of claim 13, wherein the ceramic coating comprises at least one of a nitride material and a carbide material.

15. The method of claim 13, wherein the ceramic coating comprises at least one of TiN, CrN, TiAlN, CrC, AlTiN, ZrN, and TiCN.

16. The method of claim 13, wherein forming a ceramic coating over the selected portion of the polycrystalline diamond element comprises depositing a vaporized material over the selected portion of the polycrystalline diamond element.

17. The method of claim 13, further comprising removing at least a portion of the ceramic coating from the polycrystalline diamond element.

18. The method of claim 13, further comprising bonding the ceramic coating to the selected portion of the polycrystalline diamond element.

19. The method of claim 13, further comprising surrounding at least a portion of the ceramic coating with a substantially inert layer.

20. The method of claim 13, wherein the ceramic coating has a thickness of between approximately 1 and 10 μm.

21. The method of claim 1, wherein the selected portion includes a portion of the cemented carbide substrate.

22. The method of claim 13, wherein the selected portion includes a portion of the cemented carbide substrate.

23. The method of claim 1, wherein the cemented carbide substrate comprises a cemented tungsten carbide material.

* * * * *